United States Patent
Bang et al.

(10) Patent No.: US 7,148,129 B2
(45) Date of Patent: Dec. 12, 2006

(54) METHOD OF GROWING SELECTIVE AREA BY METAL ORGANIC CHEMICAL VAPOR DEPOSITION

(75) Inventors: Young-Churl Bang, Suwon-si (KR); Eun-Hwa Lee, Suwon-si (KR); Hyeon-Soo Kim, Suwon-si (KR); Jung-Kee Lee, Suwon-si (KR); Jun-Youn Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 280 days.

(21) Appl. No.: 10/805,790

(22) Filed: Mar. 22, 2004

(65) Prior Publication Data

US 2005/0103259 A1    May 19, 2005

(30) Foreign Application Priority Data

Nov. 17, 2003   (KR) ..................... 10-2003-0081038

(51) Int. Cl.
*H01L 21/20*   (2006.01)
(52) U.S. Cl. ................ 438/481; 117/104; 257/E21.566
(58) Field of Classification Search ................ 438/481; 257/75, 189, 200, E21.566
See application file for complete search history.

(56) References Cited

U.S. PATENT DOCUMENTS 4,876,210 A * 10/1989 Barnett et al. ................ 117/58
4,916,708 A * 4/1990 Hayakawa ................ 372/45.01
5,565,693 A * 10/1996 Sasaki et al. ................ 257/94
5,728,215 A * 3/1998 Itagaki et al. ................ 117/104
5,872,022 A * 2/1999 Motoda et al. ................ 438/39

* cited by examiner

*Primary Examiner*—Michelle Estrada
*Assistant Examiner*—Jarrett Stark
(74) *Attorney, Agent, or Firm*—Cha & Reiter, L.L.C.

(57) ABSTRACT

A method of growing a semiconductor layer in a selective area by Metal Organic Chemical Vapor Deposition (MOCVD) and a mask pattern for s ame, includes a first mask pattern and a second mask pattern that are formed on a semiconductor substrate having a (100) crystalline plane. The first mask pattern has a first window wider than the selective area and a second mask pattern has a second window and a third window. The second window is defined by spacing the second mask pattern from the first mask pattern, in correspondence with a blocking area for blocking the surface migration of III-group semiconductor source gases at edges of the first window. The third window is as wide as the selective area. The semiconductor layer is grown by MOCVD on the semiconductor substrate exposed by the second and third windows. Trenches can be etched in the second and third windows and growth layers extend from the trench beyond the surface of the InP to block gas dispersion.

9 Claims, 7 Drawing Sheets

METHOD OF GROWING SELECTIVE AREA BY METAL ORGANIC CHEMICAL VAPOR DEPOSITION

CLAIM OF PRIORITY

This application claims priority under 35 U.S.C. § 119 to an application entitled "Method of Growing Selective Area by Metal Organic Chemical Vapor Deposition," filed in the Korean Intellectual Property Office on Nov. 17, 2003 and assigned Serial No. 2003-81038, the contents of which are incorporated herein by reference.

BACKGROUND OF THE INVENTION

1. Field of the Invention

The present invention relates generally to a method of growing a selective area by MOCVD (Metal Organic Chemical Vapor Deposition).

2. Description of the Related Art

Monolithic integration of III-V group material compound semiconductor optical devices has been established as a fundamental technology for high-performance optical applications to fabrication of optical devices. This integration of technology makes possible the fabrication of multi-functional, high-performance devices, which was impossible with conventional technology that could go beyond the miniaturization or integration of devices. The integration of the III-V group devices is essential to the fabrication and operation of opto-electronic integrated circuits (OEICs), electro-absorption modulated laser (EML) optical amplifiers, and optical mode converters. Selective area growth (SAG) using MOCVD is generally used for the integration technology.

To fabricate a low-price optical part for use in an ultra high-speed optical transmission network, optical devices must be designed to have high optical coupling efficiency with the narrowest beam divergence as can be achieved from a semiconductor laser diode without a lens. For the purpose, an S SC-LD (Spot-Size Converter integrated Laser Diode) has been proposed in which a gain area in which a laser beam is emitted and a waveguide by which the laser beam travels without divergence are simultaneously fabricated through growth of a thin film in a selective area, in order to increase optical coupling efficiency and minimize optical loss between a laser diode and an optical fiber.

Figure 1A:
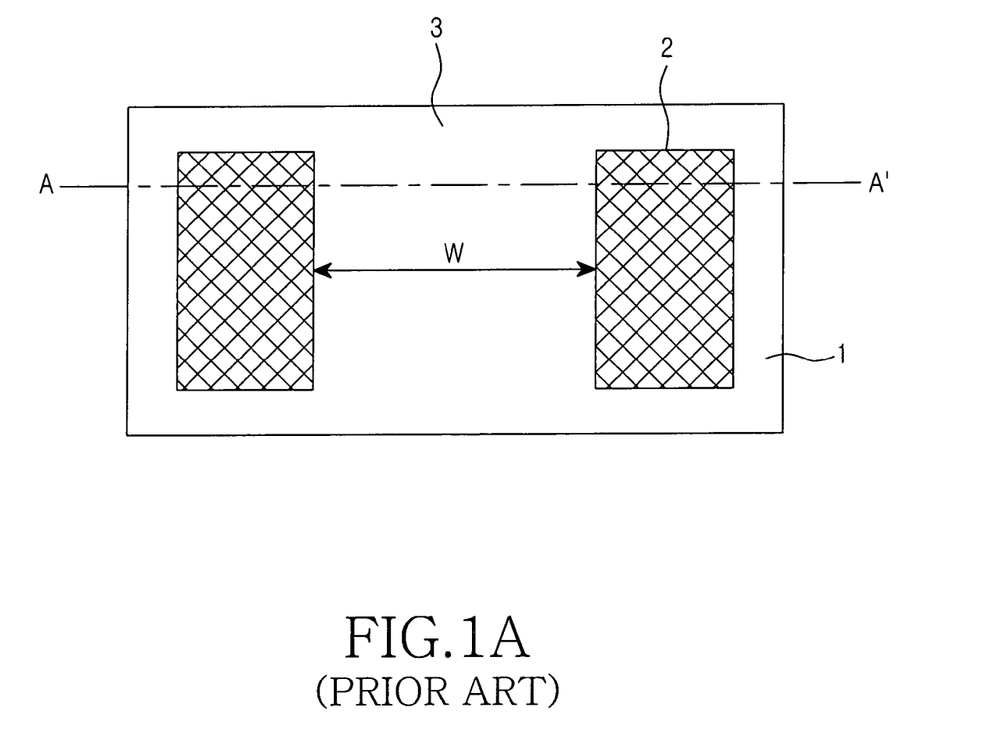
FIGS. 1A, 1B and 1C illustrate a conventional selective area growing method using MOCVD.
Figure 1B:
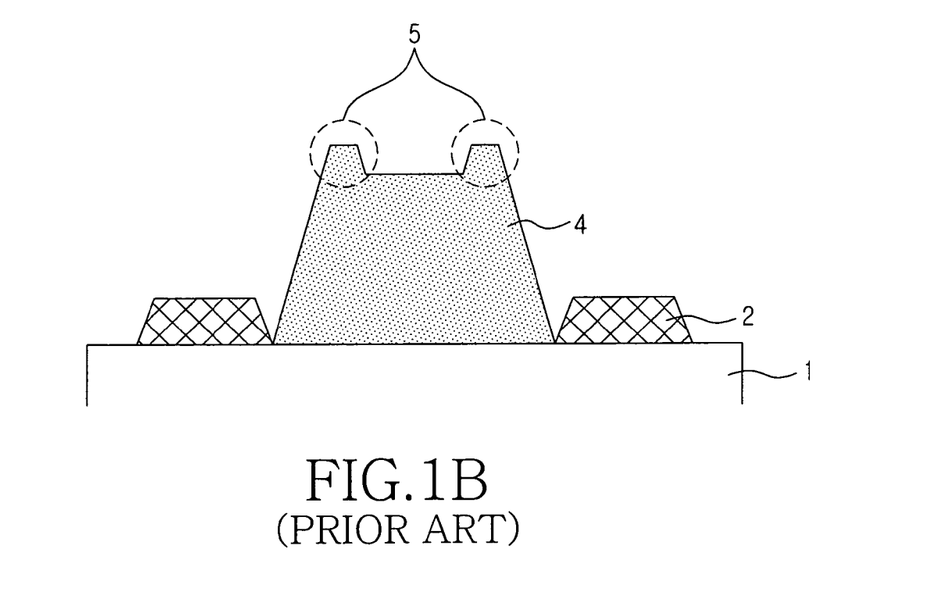
Figure 1C:
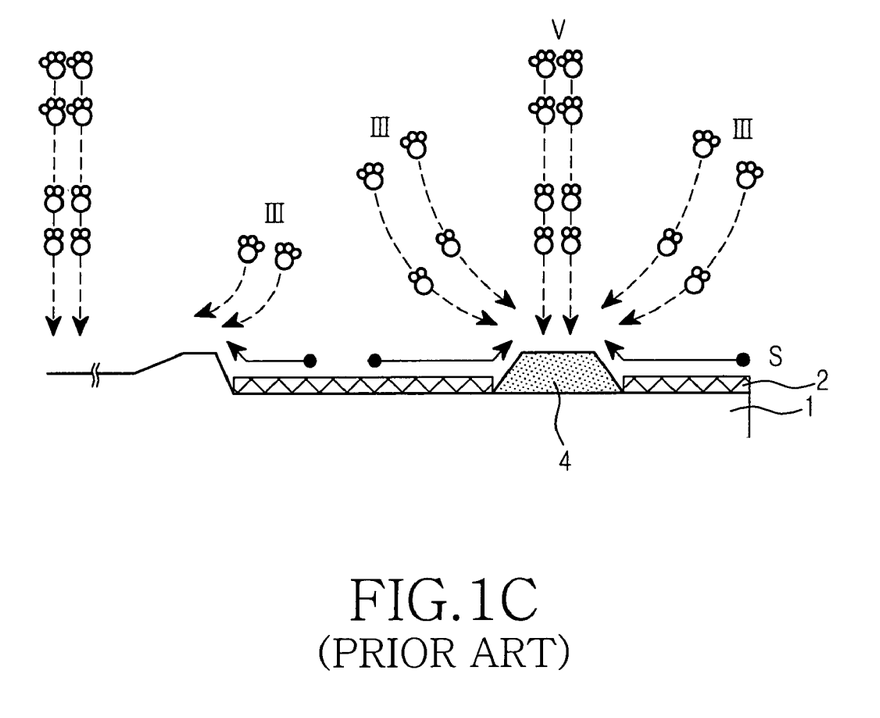

FIGS. 1A, 1B and 1C illustrate stages of an SSC-LD fabricating process, referred to for describing conventional MOCVD-based SAG FIG 1A is a plan view illustrating $SiO_2$ mask patterns 2 formed on an InP substrate 1. The width (W) of a window area 3 between the $SiO_2$ mask patterns 2 is equal to that of a semiconductor layer to be grown in a selective area.

FIG 1B is a sectional view of the structure illustrated in FIG. 1A, taken along line A–A'. The semiconductor layer 4 is grown in the window area 3 by SAG based on MOCVD. FIG. 1C provides a conceptual illustration of an SAG mechanism. Referring to FIG. 1C, III-group source gases reacts with V-group source gases on the InP substrate 1 by vertical diffusion, lateral diffusion, and surface migration of the III-group source gases. Due to the surface migration, the III-group source gases, which is not deposited on the $SiO_2$ mask patterns 2, migrates to the adjacent window and thus grows the thin film in the selective area.

This phenomenon, however, is more conspicuous at the boundary between the window area and the mask. In other words, the chemical reaction vigorously takes place at the edges of the window area by III-group source gases migrated from $SiO_2$ mask in order to grow the semiconductor layer, so the growth takes place in greater numbers at the edge of the window thank in the middle of the window, thereby causing edge spikes (5 in FIG 1B) and changing the composition of the layer 4. The edge spikes refer to the increase of thickness at edges of a grown layer. Consequently, the surface migration affects the window at large, making it difficult to ensure uniformity in the thickness and composition of the grown thin film.

In the case of AlGaInAs laser diode having a larger conduction b and offset, the device exhibits excellent operational characteristics at high temperature, the SSC-LD having a high optical coupling efficiency is fabricated more easily in a BH (Buried Hereto) structure rather than in a RWG (Ridge WaveGuard) Structure, while if the AlGaInAs SSC-LD is fabricated in the BH structure, Al oxidation makes the fabrication of BH structure difficult.

SUMMARY OF THE INVENTION

An aspect of the present invention is to solve substantially at least the above-mentioned problems and/or disadvantages, and to provide at least the advantages below. Accordingly, the present invention provides an MOCVD-based selective area growing method for growing a thin film having a planar surface and a uniform composition by preventing the surface migration of source gases at the edges of a selective area growing mask from affecting a window area.

In addition, the present invention provides an MOCVD-based selective area growing method suitable for fabricating an SSC-LD having an AlGaInAs active layer.

The above aspects of the invention are achieved by a method of growing a semiconductor layer in a selective area by MOCVD.

In accordance w ith an aspect of the present invention, a first mask pattern and a second mask pattern are formed on a semiconductor substrate having a (100) crystalline plane. The first mask pattern has a first window that is wider than the selective area and a second mask pattern that has a second window and a third window. The second window is defined by spacing the second mask pattern from the first mask pattern, in correspondence with a blocking area that blocks the surface migration of III-group semiconductor source gases at edges of the first window. The third window is as wide as the selective area. The semiconductor layer is grown by MOCVD on the semiconductor substrate exposed by the second and third windows.

The first and second mask patterns and the first, second and third windows are formed in parallel to the (100) crystalline plane of the semiconductor substrate, the second mask pattern is formed such that at least one pair of second windows are defined, for forming at least one pair of blocking areas, and the thickness of the semiconductor layer grown in the selective area is controlled by adjusting the number or width of the second windows.

In accordance with another aspect of the present invention, a first mask pattern and a second mask pattern are formed on a semiconductor substrate having (100) crystalline plane. The first mask pattern has a first window wider than the selective area and a second mask pattern has a second window and a third window. The second window is defined by spacing of the second mask pattern from the first mask pattern, in correspondence with a blocking area for blocking the surface migration of III-group semiconductor source gases at edges of the first window. The third window is as wide as the selective area. At least one trench is formed by etching the semiconductor substrate exposed by the second window, and the semiconductor layer is grown by MOCVD on the semiconductor substrate exposed by the third window and the trench.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE INVENTION

A detailed description of the present invention will be presented herein below with reference to the accompanying drawings. In the following description, well-known functions or constructions are not described in complete detail since such details would obscure the invention.

Figure 2A:
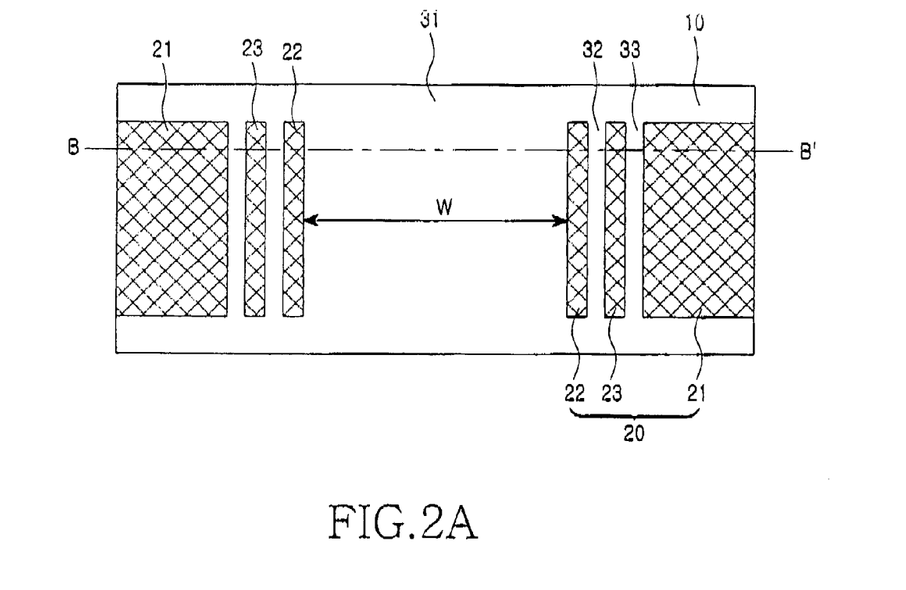
FIGS. 2A and 2B illustrate a selective area growing method using MOCVD according to an aspect of the present invention.
Figure 2B:
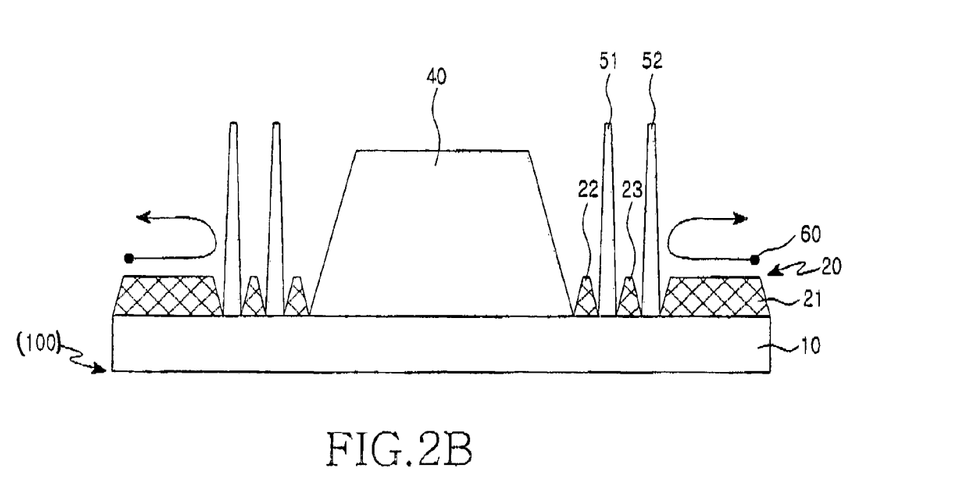

FIGS. 2A and 2B illustrate a selective area growing method using MOCVD according to an aspect of the present invention.

FIG. 2A is a plan view illustrating $SiO_2$ mask patterns 20 formed on an InP substrate having an (100) crystalline plane. The $SiO_2$ mask patterns 20 includes a pair of first mask patterns 21, and pairs of second and third mask patterns 22 and 23. The width (W) of a first window area 31 between the second mask patterns 22 is equal to the width of a semiconductor layer that is to be grown in a selective area. A second window area 32 is defined between each respective one of a second mask pattern and a third mask pattern 22 and 23, and a third window area 33 is defined between each respective one of a third mask pattern and a first mask pattern, 23 and 21. The first or central window area 31 corresponds to a layer growing area by SAG; and the other window areas 32 and 33 serve as migration blocking areas (MBAs) that prevent the surface migration of source gases.

FIG. 2B provides a sectional view of the structure illustrated in FIG. 2A, taken along line B–B'. A semiconductor layer 40 is grown in the first window area 31 by SAG based on MOCVD. Growth layers 51 and 52 are formed in the MBAs between the second and third mask patterns 22 and 23 and between the third and first mask patterns 23 and 21. The growth layers 51 and 52 function as barrier layers that block the surface migration of a III-group source gases 60, as indicated by the direction of the arrows.

Figure 3:
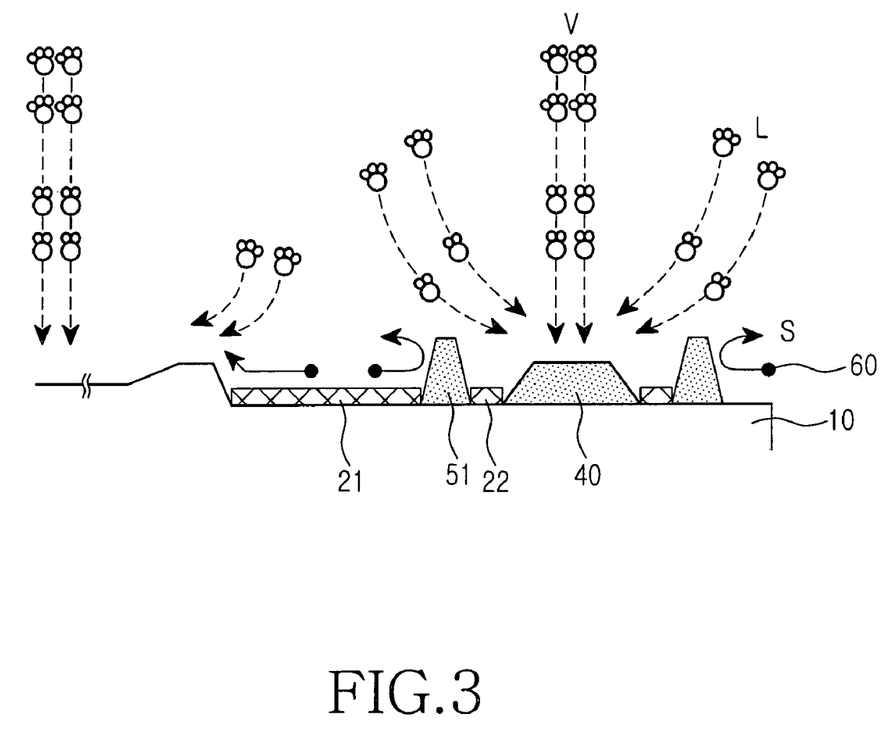
FIG. 3 is a conceptual view illustrating a selective area growing mechanism according to the present invention.

FIG. 3 provides a conceptual view illustrating an SAG mechanism according to the present invention. Referring to FIG. 3, the III-group source gases 60 reacts with a V-group source gases on the InP substrate 10 by the vertical diffusion, lateral diffusion, and surface migration of the III-group source gases 60. Especially, the surface migration is created by movement of the III-group source gases, which is not deposited on the $SiO_2$ mask patterns 21. Most of the migrating source gases 60 is caught by the migration blocking areas and is deposited before it reaches the first or central window 31, or not introduced in the central window 31 due to the grown barrier layer 51. It can thus be concluded that the SAG in the central window 31 is attributed mainly to diffusion.

Referring to FIGS. 2A and 2B, the mask patterns 20 are arranged in parallel to the (100) crystalline plane of the semiconductor substrate 10. The characteristics of the compound semiconductor grown layers in the selective area can be controlled by adjusting the size of the mask patterns and the number and width of MBAs. Table 1 below illustrates the characteristics of growth layers in relation to these variables.

TABLE 1

| Sample number (AlGaInAs bulk SAG) | 1 | 2 | 3 | 4 | 5 | 6 |
|---|---|---|---|---|---|---|
| Mask size (μm) | 50 | 100 | 60 | 70 | 95 | 80 |
| Number of MBAs | 0 | 0 | 1 | 2 | 2 | 3 |
| PL wavelength (nm) | 1263 | 1300 | 1235 | 1219 | 1216 | 1205 |
| PL Intensity (mV) | 22.8 | 14.9 | 20.9 | 23.4 | 24.1 | 20.8 |
| PL FWHM (meV) | 70.8 | 77.7 | 67.5 | 68.3 | 68.5 | 69.5 |

In Table 1, samples 1 and 2 are conventional SAG layers without forming MBAs and samples 3, 4, 5 and 6 are MBA-using SAG layers having different mask sizes and different numbers of MBAs. For the testing of the samples, the central window is 20 μm wide, the mask patterns for defining an MBA is 5 μm wide, and the MBA is 10 μm wide.

The SAG characteristics become better as photoluminescence(PL) intensity is larger and as FWHM (Full Width at Half Maximum) is smaller. Another consideration is that an SAG TEF (Thickness Enhancement Factor). TEF is defined as overgrowth of a selectively grown layer over a typical epitaxial layer. The TEF increases with the mask size and a higher TEF value is favorable for development of the SSC-LD. However, the increase of TEF leads to bad PL intensity and FWHM characteristics. Thus, an optimum condition must be found in consideration of the trade-off between TEF and PL intensity/FWHM.

Figure 4A:
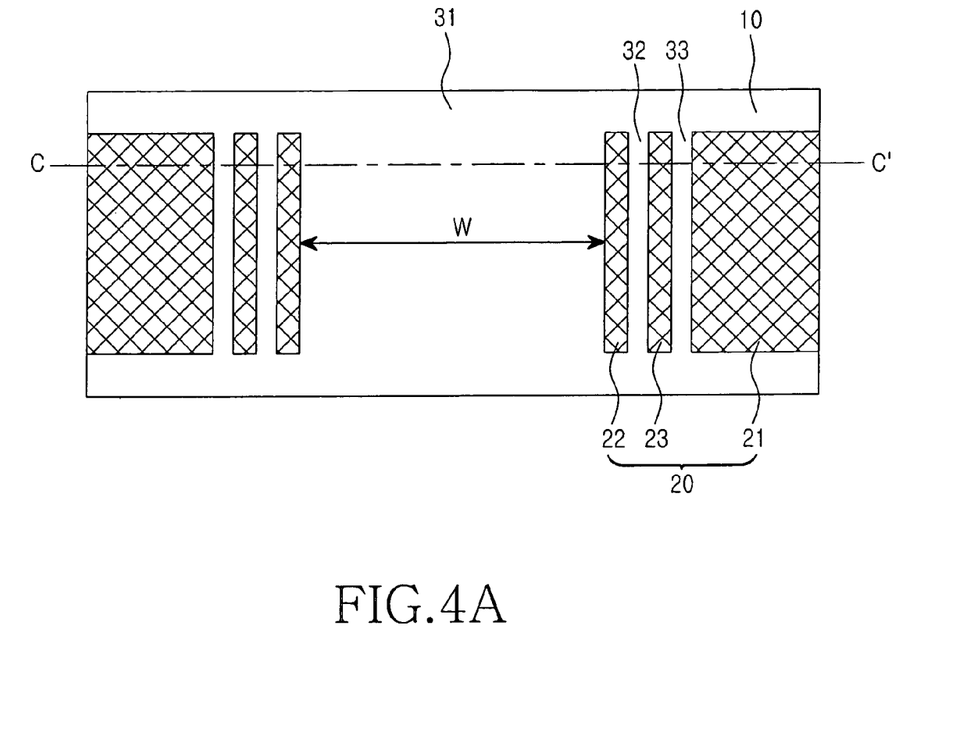
FIGS. 4A, 4B and 4C illustrate a selective area growing method using MOCVD according to another aspect of the present invention.
Figure 4B:
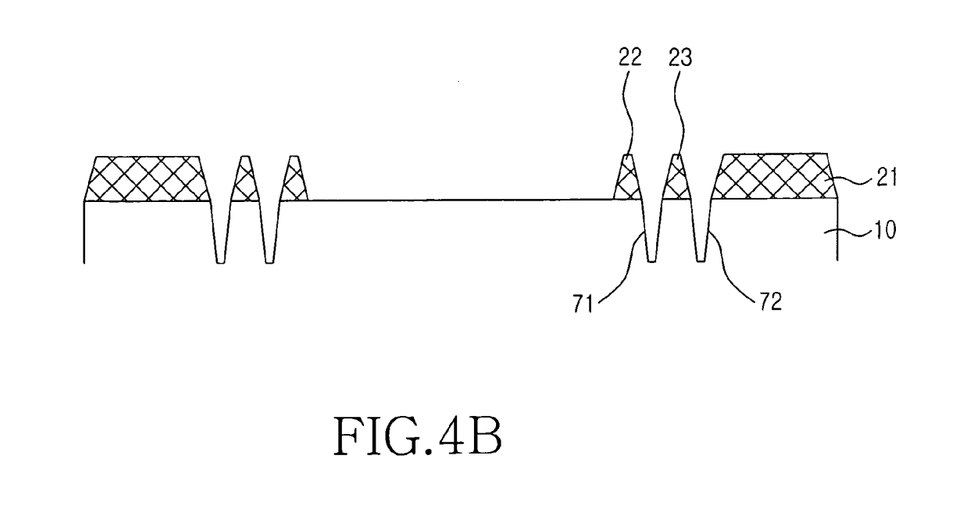
Figure 4C:
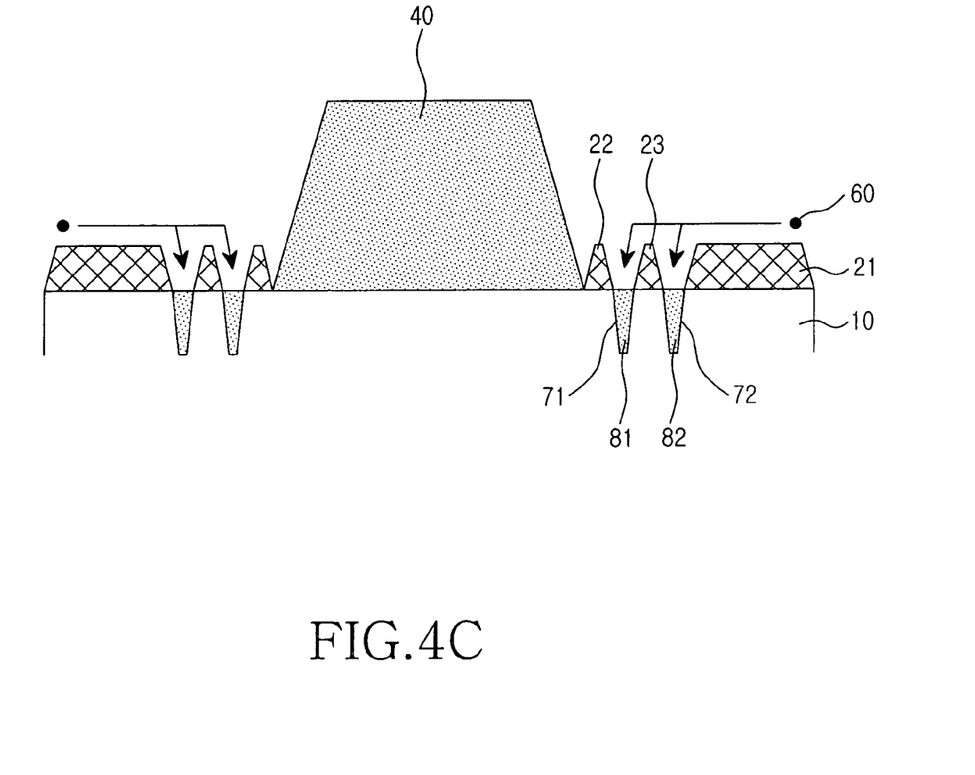

FIGS. 4A, 4B and 4C illustrate a selective area growing method using MOCVD according to another aspect of the present invention.

FIG. 4A is a plan view illustrating the $SiO_2$ mask patterns 20 formed on the InP substrate 10. The $SiO_2$ mask patterns 20 include the pair of first mask patterns 21, and the pairs of second and third mask patterns 22 and 23 arranged between the first pair of mask patterns 21. The width (W) of the first/central window area 31 is arranged between the second pair of mask patterns 22 is equal to that of a semiconductor layer to be selectively grown. The first MBA 32 is defined between each pair of the second and third mask patterns 22 and 23, and the second MBA 33 is defined between each pair of the third and first mask patterns 23 and 21.

FIG. 4B is a sectional view of the structure illustrated in FIG. 4A, taken along line C–C'. Trenches 71 and 72 are formed into the first and second MBAs 32 and 33 by etching the InP substrate 10.

FIG. 4C illustrates the semiconductor layer 40 grown in the first window area 31 by SAG based on MOCVD. Growth layers 81 and 82 are formed in the trenches 71 and 72 between the second and third mask patterns 22 and 23 and between the third and first mask patterns 23 and 21, as the III-group source gases 60 is trapped in the trenches 71 and 72 during surface migration. The thickness of the selectively grown semiconductor layer is adjusted by controlling the number, width and depth of the trenches, and the depth of the trenches is controlled such that the surface of the trenches are even with that of the substrate after the thin film is selectively grown.

Figure 5:
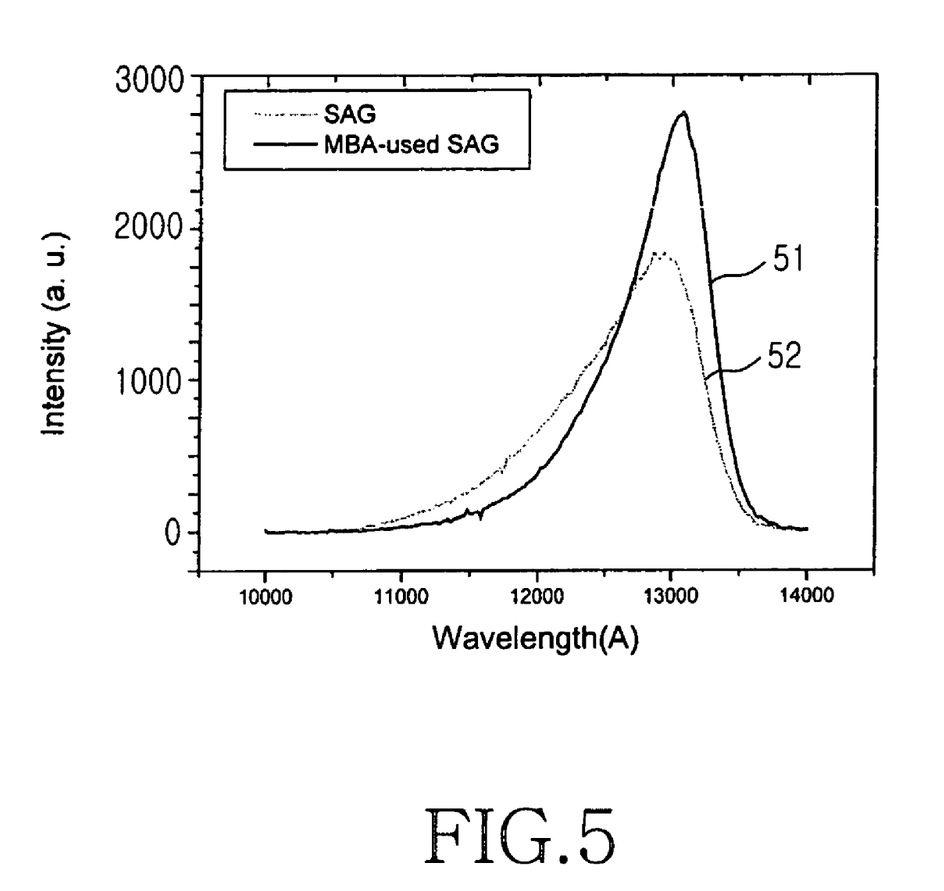
FIG. 5 is a graph illustrating a comparison between SAG characteristics according to the present invention and conventional SAG characteristics.

FIG. 5 is a PL graph comparison of the inventive SAG characteristics versus the conventional SAG characteristics. In FIG. 5, an SAG curve 51 indicates a higher PL intensity than a conventional SAG curve 52. The SAG curve 51 also shows an FWHM of 50.6 meV lower than 78.8 meV in the SAG curve 52.

In accordance with the present invention, particularly as described above during SAG using MOCVD, the window of a selective area growth mask is made larger than that of an expected selective area. Migration blocking areas are formed between the windows to block the surface migration of a semiconductor source gases, thereby preventing the influence of the surface migration on the selective area window. Therefore, a selectively grown layer is further planarized and has a uniform composition. When the present invention is applied to fabrication of an SSC-LD having an AlGaInAs active layer, the SSC-LD can have a high optical coupling efficiency.

While the invention has been shown and described with reference to certain preferred aspects thereof, it will be understood by those skilled in the art that various changes in form and details may be made therein without departing from the spirit and scope of the invention as defined by the appended claims.

What is claimed is:

1. A method of growing a semiconductor layer in a selective area by MOCVD (Metal Organic Chemical Vapor Deposition), comprising the steps of:
    (a) forming a first mask pattern on a semiconductor substrate having a (100) crystalline plane;
    (b) forming a second mask pattern adjoining a first window and a window adjacent to the first mask pattern, wherein the first window represents the selective area, and wherein the window adjacent to the first mask pattern separates the second mask pattern from the first mask pattern and comprises a second window and a third window, the second and third windows corresponding to a blocking area for blocking the surface migration of a III-group semiconductor source gases at edges of the third window;
    (c) forming a trench by etching the semiconductor substrate exposed by the window adjacent to the first mask; and
    (d) growing the semiconductor layer having a trapezoidal shape by MOCVD on the semiconductor substrate exposed by the first window and the trench adjacent to the first mask pattern.

2. The method of claim 1, wherein the first and second mask patterns and the first, second and third windows are formed in parallel to the (100) crystalline plane of the semiconductor substrate.

3. The method of claim 2, wherein step (b) includes forming the second mask pattern—such that the window adjacent to the first mask pattern is configured to form at least one pair of blocking areas, wherein the thickness of the semiconductor layer grown in the selective area is controlled by adjusting the semiconductor grown on the window adjacent to the first mask pattern or a width of the window adjacent to the first mask pattern.

4. The method of claim 1, wherein the semiconductor layer grown in the selective area is an active layer for an SSC-LD (Spot-Size Converter integrated Laser Diode).

5. The method of claim 1, wherein the semiconductor layer grown in the selective area is formed of AlGaInAs.

6. A method of growing a semiconductor layer in a selective area by MOCVD (Metal Organic Chemical Vapor Deposition), comprising the steps of:
    (a) forming a first mask pattern; on a semiconductor substrate having a (100) crystalline plane;
    (b) forming a second mask pattern adjoining a first window and a window adjacent to the first mask pattern, wherein the first window represents the selective area, and wherein the window adjacent to the first mask pattern separates the second mask pattern from the first mask pattern and comprises one second window and a third window, the second and third windows corresponding to a blocking area for blocking the surface migration of III-group semiconductor source gases at edges of the third window;
    (c) forming at least one trench by etching the semiconductor substrate exposed by the window adjacent to the first mask pattern; and
    (d) growing the semiconductor layer by MOCVD on the semiconductor substrate exposed by the first window and the trench.

7. The method of claim 6, wherein both the first and second mask patterns and the first, second and third windows are formed in parallel to the (100) crystalline plane of the semiconductor substrate.

8. The method of claim 6, wherein the thickness of the semiconductor layer grown in the selective area is controlled by adjusting a number, width or depth of trenches.

9. The method of claim 6, wherein the trench is formed into the shape of a reverse mesa or a square.

* * * * *